United States Patent [19]

Vinal

[11] Patent Number: 5,247,212
[45] Date of Patent: Sep. 21, 1993

[54] COMPLEMENTARY LOGIC INPUT PARALLEL (CLIP) LOGIC CIRCUIT FAMILY

[75] Inventor: Albert W. Vinal, Cary, N.C.

[73] Assignee: Thunderbird Technologies, Inc., Research Triangle Park, N.C.

[21] Appl. No.: 648,219

[22] Filed: Jan. 31, 1991

[51] Int. Cl.[5] ............... H03K 19/003; H03K 19/017; H03K 19/094; H03K 17/04; H03K 19/20
[52] U.S. Cl. .................... 307/448; 307/443; 307/451; 307/449; 307/448
[58] Field of Search .................. 307/443, 451–453, 307/475, 279

[56] References Cited

U.S. PATENT DOCUMENTS

| T952,012 | 11/1976 | Lee | 307/451 |
|---|---|---|---|
| 3,728,556 | 4/1973 | Arnell | 307/279 X |
| 3,911,289 | 10/1975 | Takemoto | 307/451 |
| 3,967,988 | 7/1976 | Davidsohn | 357/41 |
| 4,045,692 | 8/1977 | Morokawa et al. | 307/279 |
| 4,053,792 | 10/1977 | Cannistra et al. | 307/451 |
| 4,080,539 | 3/1978 | Stewart | 307/264 |
| 4,216,390 | 8/1980 | Stewart | 307/264 |
| 4,258,272 | 3/1981 | Huang | 307/475 |
| 4,390,988 | 6/1983 | Best et al. | 307/243 X |
| 4,491,741 | 1/1985 | Parker | 307/448 X |
| 4,567,385 | 1/1986 | Falater et al. | 307/443 |
| 4,645,962 | 2/1987 | van Tran | 307/451 X |
| 4,649,296 | 3/1987 | Shoji | 307/451 |
| 4,698,526 | 10/1987 | Allan | 307/475 |
| 4,701,642 | 10/1987 | Pricer | 307/446 |
| 4,701,643 | 10/1987 | Laude et al. | 307/450 |
| 4,764,691 | 8/1988 | Jochem | 307/468 |
| 4,785,204 | 11/1988 | Terada et al. | 307/451 |
| 4,797,580 | 1/1989 | Sunter | 307/451 |
| 4,798,979 | 1/1989 | Lee et al. | 307/450 |
| 4,810,906 | 3/1989 | Shah et al. | 307/448 |
| 4,877,976 | 10/1989 | Lach et al. | 307/450 |
| 4,928,156 | 5/1990 | Alvis et al. | 357/23.4 |
| 4,998,028 | 3/1991 | Chappell et al. | 307/451 X |
| 5,001,367 | 3/1991 | Vinal | 307/448 |
| 5,030,853 | 7/1991 | Vinal | 307/451 |
| 5,034,629 | 7/1991 | Kinugasa et al. | 307/451 X |
| 5,115,150 | 3/1992 | Ludwig | 307/475 |
| 5,117,130 | 5/1992 | Shoji | 307/448 |

FOREIGN PATENT DOCUMENTS

| 0323896 | 12/1989 | European Pat. Off. . | |
|---|---|---|---|
| 3511625 | 3/1985 | Fed. Rep. of Germany | 307/448 |
| 2276736 | 5/1975 | France | 307/451 |
| 5336167 | 9/1976 | Japan | 307/451 |
| 60236322 | 5/1984 | Japan | 307/451 |
| 2092850 | 2/1982 | United Kingdom | 307/451 |

OTHER PUBLICATIONS

Latching Receiver, IBM Technical Disclosure Bulletin, vol. 33, No. 8, Jan. 1991, pp. 371–372.
Circuit Gate Widths As a Function of Ground Shift Designing, Chadwick et al., IBM Technical Disclosure Bulletin, vol. 21, No. 4, Sep. 1978, pp. 1560–1562.
Electronic Engineers' Handbook, Fink et al., 1982, pp. 16-16, to 16-19.
CVS Load Circuit, IBM Technical Disclosure Bulletin, vol. 28, No. 6, Nov. 1985, pp. 2576–2577.

Primary Examiner—Edward P. Westin
Assistant Examiner—Andrew Sanders
Attorney, Agent, or Firm—Bell, Seltzer, Park & Gibson

[57] ABSTRACT

A high speed low Capacitance Complementary Logic Input Parallel (CLIP) logic family includes an FET driving stage, a complementary FET inverter, and at least one gating FET. The dimensions of the gating FET are controlled relative to the dimensions of the driving stage FETs to provide a high speed logic circuit. AND and OR CLIP logic circuits may be provided. A clocked CLIP logic circuit may be provided by adding a clocking FET. A latching clocked CLIP logic circuit may also be provided by adding a latching FET. In the latching clocked CLIP logic circuit, the gate output is latched so that it does not change during the clock period regardless of changes in the logic inputs of the circuit. The speed of the CLIP logic circuits may be further increased by including germanium in the channel of its P-channel FETs to thereby increase carrier mobility in the P-channel FETs. The N-channel FETs are free of germanium. The internal capacitance of the CLIP logic circuits is also decreased by using common diffusion regions in the integrated circuit for pairs of driving stage FETs. Common source and/or common drain diffusion regions may be used.

25 Claims, 9 Drawing Sheets

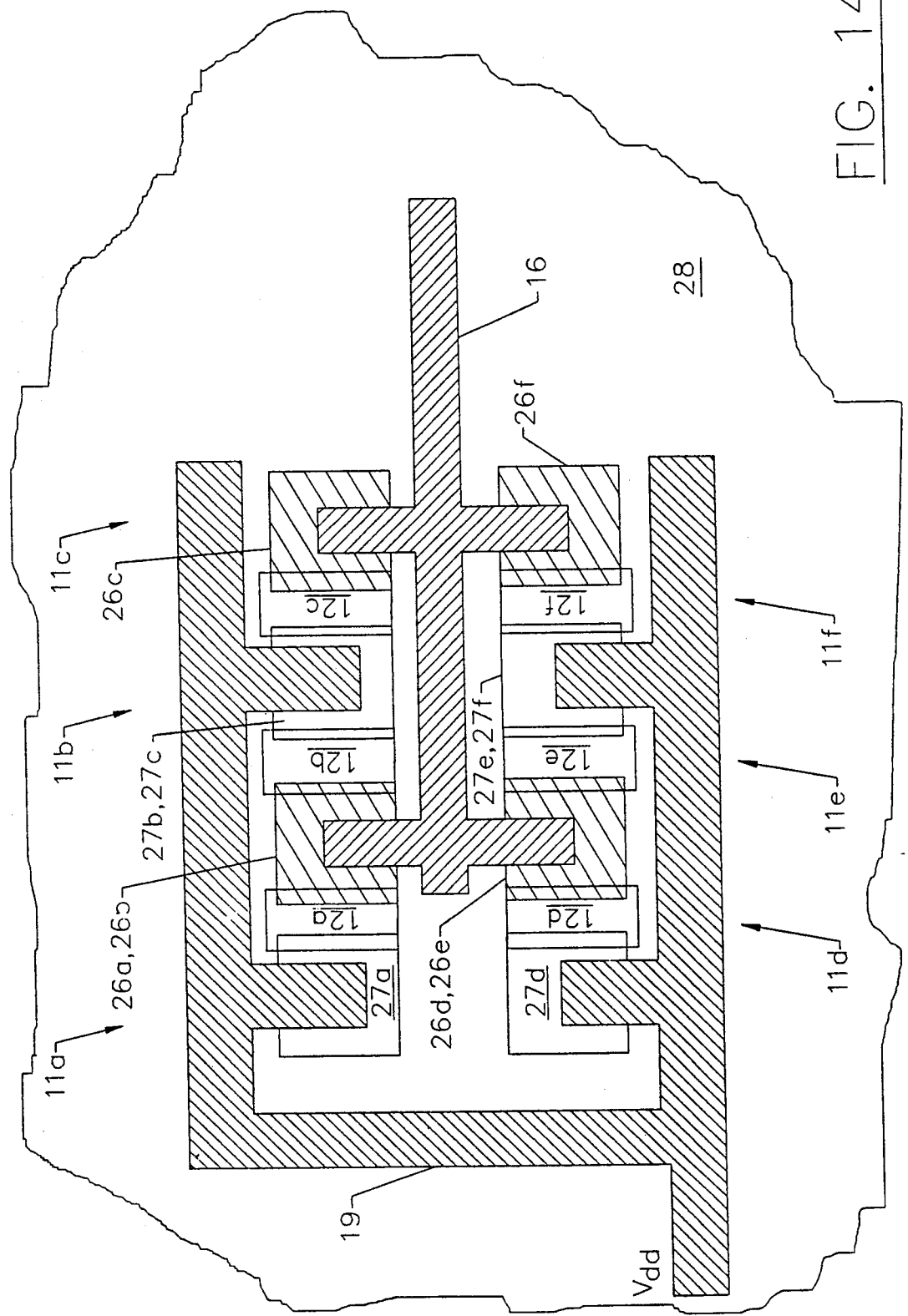

5,247,212

COMPLEMENTARY LOGIC INPUT PARALLEL (CLIP) LOGIC CIRCUIT FAMILY

FIELD OF THE INVENTION

This invention relates to integrated circuit field effect transistor (FET) logic circuits, and more particularly to high speed, high density complementary all-parallel FET logic circuits.

BACKGROUND OF THE INVENTION

Complementary Field Effect Transistor (FET) logic circuits, and in particular Complementary Metal Oxide Semiconductor (CMOS) logic circuits have become increasingly popular for integrated circuit logic, among other reasons because of their high circuit density and low power dissipation. A typical CMOS logic gate is illustrated in FIG. 1 of U.S. Pat. No. 3,911,289 to Takemoto entitled *MOS Type Semiconductor IC Device*. A CMOS logic gate typically includes a driving stage having a plurality of FETs of a first conductivity type connected in parallel and a load stage comprising a like plurality of serially connected FETs of opposite conductivity type. Each logic signal input is applied simultaneously to a pair of transistors, one driver and one load.

Unfortunately, the serial connection of the load transistors in conventional CMOS logic gates reduces the toggle rate or switching speed of the gate and also reduces the number of inputs which may be applied to the gate (referred to as "fan-in"). To overcome these problems an "all parallel" CMOS gate design has heretofore been proposed. One all parallel CMOS logic gate is described in FIG. 3A of the aforementioned U.S. Pat. No. 3,911,289, in which the serial load transistors are replaced by a first load which may be an MOS transistor or a resistor, and a second load comprising an MOS transistor having opposite conductivity type from the driver stage transistors.

A particularly high performance all-parallel logic family is described in application Ser. No. 7/338,280 filed on Apr. 14, 1989 to the present inventor Albert W. Vinal and entitled *High Speed Complementary Field Effect Transistor Logic Circuits*, now U.S. Pat. No. 5,001,367, which is assigned to the assignee of the present invention, the disclosure of which is hereby incorporated herein by reference. A high speed, high density low power dissipation complementary FET logic circuit is disclosed, in which the voltage transfer function of the logic gate's complementary FET inverter output stage is deliberately skewed to dramatically decrease the lift-off interval for the logic gate and thereby dramatically increase the speed of the gate. A switching speed of 500 megahertz or greater may be obtained, which is a factor of five or more greater than prior art all-parallel logic designs, for example the design disclosed in the aforementioned U.S. Pat. 3,911,289.

Notwithstanding the above described improvement, there is a continued need for higher performance all-parallel logic designs. In particular, there is a continued need for a high speed logic circuit family in which the rise and delay times of the gate are minimized. In other words, the internal delay of the gate in providing a logic output signal which accurately reflects the state of the logic input signals must be minimized.

Another major limitation on the speed of complementary FET logic inputs is the inherent difference between the saturation current of P-channel devices compared to those of N-channel devices. In particular, silicon P-channel FET devices deliver about half the saturation current as comparable N-channel FET devices. The lower saturation current and corresponding lower carrier mobility of P-channel device limits the overall speed of the logic gate.

Finally, the internal capacitance of the logic gate also is a major roadblock in increasing its speed. The internal capacitance of the gate also typically limits the number of logic inputs which can be handled by a single gate (fan-in). Applications that require large numbers of logical inputs, such as decoding operations, therefore typically require "trees" of cascaded logic gates, which dramatically increase the overall delay time.

SUMMARY OF THE INVENTION

It is therefore an object of the present invention to provide a high speed complementary all-parallel FET logic circuit family.

It is another object of the present invention to provide a high speed complementary all-parallel FET logic family which exhibits minimum delay.

It is yet another object of the invention to provide a high speed complementary all-parallel FET logic family, the performance of which is not limited by the inherently lower saturation current and carrier mobility of P-channel FET devices.

It is still another object of the present invention to provide a high speed complementary all-parallel FET logic family which exhibits low internal capacitance so that large numbers of logic inputs may be handled by a single gate.

These and other objects are provided according to the present invention by a Complementary Logic Input Parallel ("CLIP") logic circuit family, which includes a driving stage having at least one FET of a first conductivity type, with each FET having at least one control electrode for receiving logical input signals. The driving stage FETs are connected between a common output and a first potential level. A complementary FET inverter, comprising a pair of complementary FETs, is serially connected between the first potential level and a second potential level, with the input of the complementary inverter being connected to the common output.

According to the invention, at least one gating FET of second conductivity type is provided, with the gating FET being connected between the second potential level and the common input. The control electrode of the gating FET is connected to the control electrode of one of the driving stage FETs. The dimensions of the gating FETs are controlled relative to the dimensions of the driving stage FETs to provide a high speed logic circuit. In particular, the ratio of the channel width of the gating FETs to the channel width of the driving stage FETs is substantially equal to the ratio of the square channel saturation current of the driving stage FETs to the square channel saturation current of the gating FETs times the ratio of the channel length of the gating FETs to the channel length of the driving stage FETs times the number of gating FETs, divided by 2. Stated mathematically:

$$\frac{Z_g}{Z_d} = \left(\frac{I_{satd}^*}{I_{satg}^*}\right)\left(\frac{L_g}{L_d}\right)\left(\frac{S_g}{2}\right).$$

where $Z_g$ is the channel width of the gating transistors, $Z_d$ is the channel width of the driving stage transistors, $I^*_{satd}$ is the saturation current for a square channel driving transistor, $I^*_{satg}$ is the saturation current for a square channel gating transistor, $L_g$ is the channel length of the gating transistors, $L_d$ is the channel length of the driving stage transistors, and $S_g$ is the number of gating transistors. It has been found, according to the invention that when the geometry of the gating FETs are arranging as described above, the internal delay time of the logic gate is dramatically decreased thereby improving the speed of the gate while still insuring reliable logic switching.

In a CLIP AND gate, the driving stage transistors are P-channel FETs and the gating transistors are N-channel FETs. In a preferred embodiment of the present invention where the channel lengths of the driving stage and gating FETs are equal the above formula reduces to $Z_n = A_p/2\eta$ where $Z_n$ is the channel width of the N-channel gating FETs, $Z_p$ is the channel width of the P-channel driving stage FETs and $\eta$ is the ratio of the saturation currents of an N-channel FET to a P-channel FET, which is also equal to the ratio of carrier mobilities and typically about 2.4 for pure silicon. In a CLIP OR gate according to the present invention the relationship between the N and P-channel FETs is reversed.

According to one aspect of the present invention, a clocked CLIP logic circuit may be provided by adding a clock FET of the first conductivity type, the control electrode of which receives the clock input signal, with the clock FET being connected between the common input and the first potential level. The clock FET provides high speed switching in synchronization with a clock input, and eliminates standby circuit power.

According to another aspect of the present invention, a latching clocked CLIP logic circuit may be provided by adding a latching FET of the second conductivity type, the control electrode of which is connected to the output of the logic gate's complementary inverter, with the latching FET connected in parallel with the gating FETs. In the latching clocked logic circuit the logic gate output is latched so that it does not change during the clock period regardless of changes in the logic inputs to the circuit.

A clocked CLIP OR circuit according to the present invention includes a driving stage of N-channel FETs, an N-channel clocking FET which is connected between the second potential level and the driving stage FETs, and a P-channel gating FET, the control input of which is connected to the control electrode of the clocking FET and which is connected between the first potential level and the common input. A latching clocked CLIP OR gate may also be provided by adding an N-channel latching FET, the control electrode of which is connected to the inverter output, with the latching FET being connected in parallel with the driving stage.

According to another aspect of the present invention, the speed of the CLIP logic circuits described above is further increased by including germanium in the channels of the P-channel FETs, to thereby increase the carrier mobility in the P-channel FETs. The N-channel FETs are free of germanium so that the carrier mobility of only the P-channel devices is increased. In a preferred embodiment up to 38 atomic percent of the silicon P-channel is germanium, to thereby substantially equalize the carrier mobility of the N-channel FETs and the P-channel FETs. Accordingly, the saturation current limitation of P-channel FETs is reduced and may even be eliminated. It will be understood by those having skill in the art germanium may be included in P-channel FETs of all complementary FET logic circuits to thereby equalize the carrier mobilities in the P and N-channel devices and thereby increase the logic circuit speed.

According to yet another aspect of the present invention, the internal capacitance of the CLIP logic circuits is decreased by using common diffusion regions in the integrated circuit, for pairs of driving stage transistors. The use of the common diffusion region between pairs of FET driving transistors reduces the capacitive loading of the common output by a factor of two thereby further increasing the switching speed of the CLIP logic circuits. In particular, the sources of a pair of FET driving transistors may be formed in a first common diffusion region, and/or the drains of a pair of FET driving transistors may be formed in a second common diffusion region. It will also be understood by those having skill in the art that the common diffusion regions may be applied to the driving stage of other all parallel logic circuits to thereby reduce the load capacitance thereof and increase the switching speed.

BRIEF DESCRIPTION OF THE DRAWINGS

FIGS. 14A and 14B illustrate common diffusions for driving stage transistors according to the present invention.

DESCRIPTION OF A PREFERRED EMBODIMENT

Figure 1:
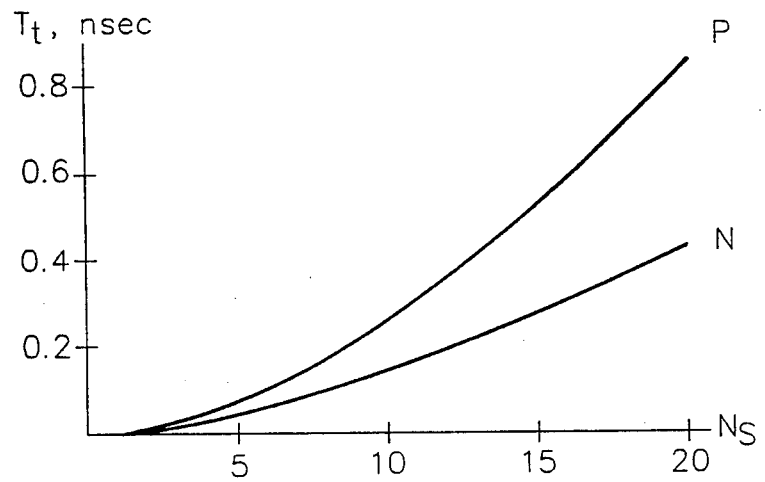
FIG. 1 graphically illustrates carrier transit time versus the number of serial transistors for a conventional CMOS logic gate.

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Prior to describing the Complementary Logic Input Parallel (CLIP) family of Field Effect Transistor (FET) logic circuits, a general discussion of speed considerations in FET logic circuits will be presented. Then, the basic CLIP logic gates of the present invention will be described, followed by a description of clocked CLIP logic gates, latching clocked CLIP logic gates and a latching CLIP output logic cell. A description of germanium containing P-channel FETs will then be presented, followed by a description of the common diffusions for the driving stage FETs.

Speed Considerations For FET Logic Circuits

As already described, complementary FET logic circuits, and in particular complementary Metal Oxide Semiconductor (CMOS) logic circuits, have become increasingly popular for high density integrated circuit logic. A primary advantage of CMOS logic circuits is that they dissipate power only during the switching interval and dissipate virtually no power in either digital rest state. Unfortunately, CMOS technology requires that P- and N-channel FETs be placed in series to achieve a desired logic function. Serializing FETs slows down the switching speed (toggle rate) of the logic gate, among other reasons because of reduced drive current, increased transit time and increased diffusion capacity. These reasons will now be described.

The series connection of transistors reduces the effective drive current in direct proportion to the number of transistors connected in series. The reduced drive current can be overcome by increasing the channel width of the series connected transistors by the same factor as the number connected in series. Unfortunately, this solution compromises the "fan in" capability of the logic gate because the gate input and drain diffusion capacitance of each serial transistor increases directly with the channel width.

Serializing transistors also increases the carrier transit time in the string of serial transistors, thereby decreasing the switching speed. Transit time is not linear with the number of devices connected in series. The expression for carrier transit time for the number of transistors connected in series is defined by:

$$T_t = \frac{(N_s L_o)^2}{\mu_o V_{dd}} \left( 1 + \frac{V_{dd} \mu_o}{N_s L_o V_{sat}} \right) \quad (1)$$

Where;
$T_t$ is the transit time,
$N_s$ is the number of transistors connected in series,
$L_o$ is the channel length,
$\mu_o$ is the carrier mobility at low level electric fields,
$V_{dd}$ is the power supply voltage, and
$V_{sat}$ is thermal saturation velocity.

Referring to FIG. 1, the transit time $T_t$ for $0.8\mu$ N-and P-channel silicon technology is plotted as a function of the number of serial transistors $N_s$. In register decoding and other circuits it is not uncommon to require twenty input functions. The need for twenty inputs dramatically increases the transit time of the logic gate. Accordingly, in CMOS technology "tree" logic, comprising a number of cascaded stages of logic gates, is often necessary to handle a large number of logic inputs. Unfortunately, the large number of cascaded connected gates also dramatically increases the rise or fall time between the input signals and the cascaded output signal.

Finally, diffusion capacity is introduced at each drain-source junction point when FETs are connected in series. This diffusion capacity must be charged when current is caused to flow, resulting in a delay of input drain current, thereby inhibiting the maximum switching speed of the logic circuits.

Figure 2A:
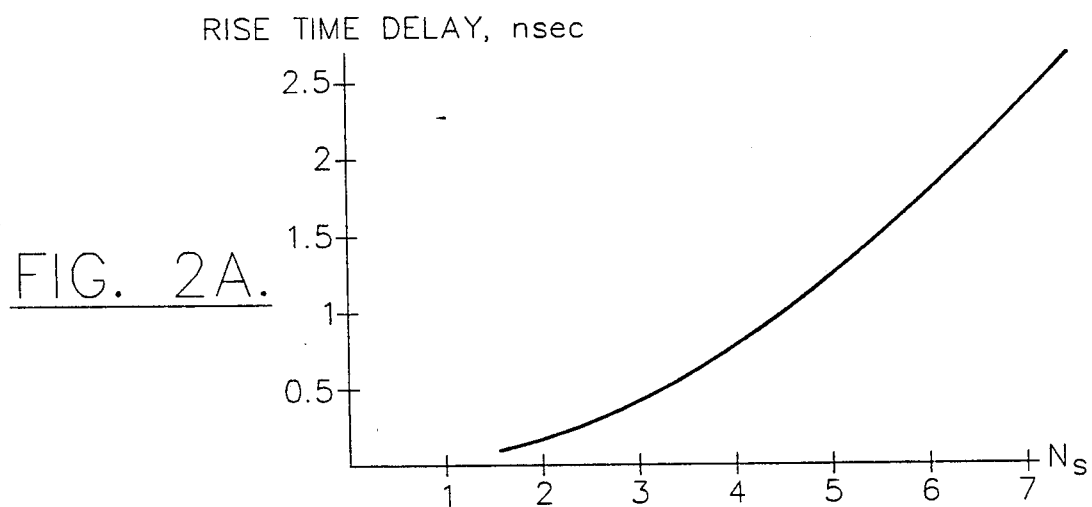
FIGS. 2A and 2B illustrate rise time delay versus gate delay for a CMOS NAND gate and a CMOS NAND-NOR tree.
Figure 2B:
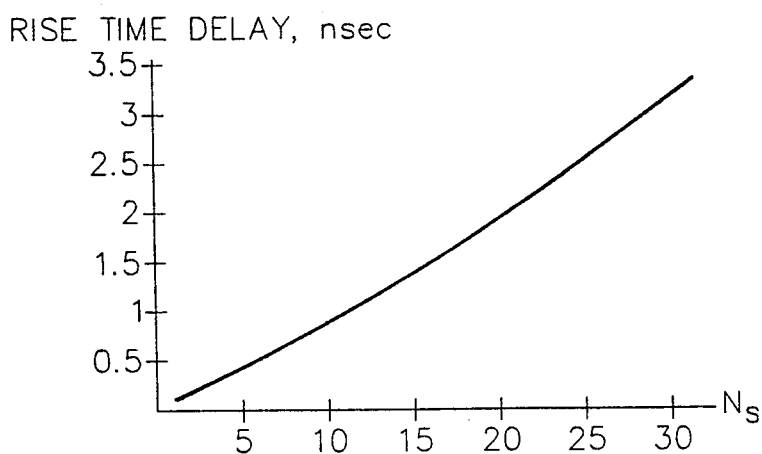

FIG. 2A graphically illustrates $0.8\mu$ CMOS NAND gate rise delay as a function of the number of fixed width transistors connected in series. The channel width for the series transistors correspond to that required for symmetric inverter voltage transfer function, i.e. the N-channel width is $Z_n$ and the P-channel width is $\eta Z_n$. FIG. 2B is the plot of $0.8\mu$ CMOS NAND gates driving NOR gates in which the width of the series transistors is increased in proportion to the number connected in the series. The rise delay of CMOS logic tree technology where each stage has N transistors in series is obtained by multiplying the rise delay per stage by the number of stages. A rise delay of 2 nanoseconds is quite typical and thereby inhibits the ultimate switching speed of logic circuits.

Basic CLIP Logic Gates

Figure 3:
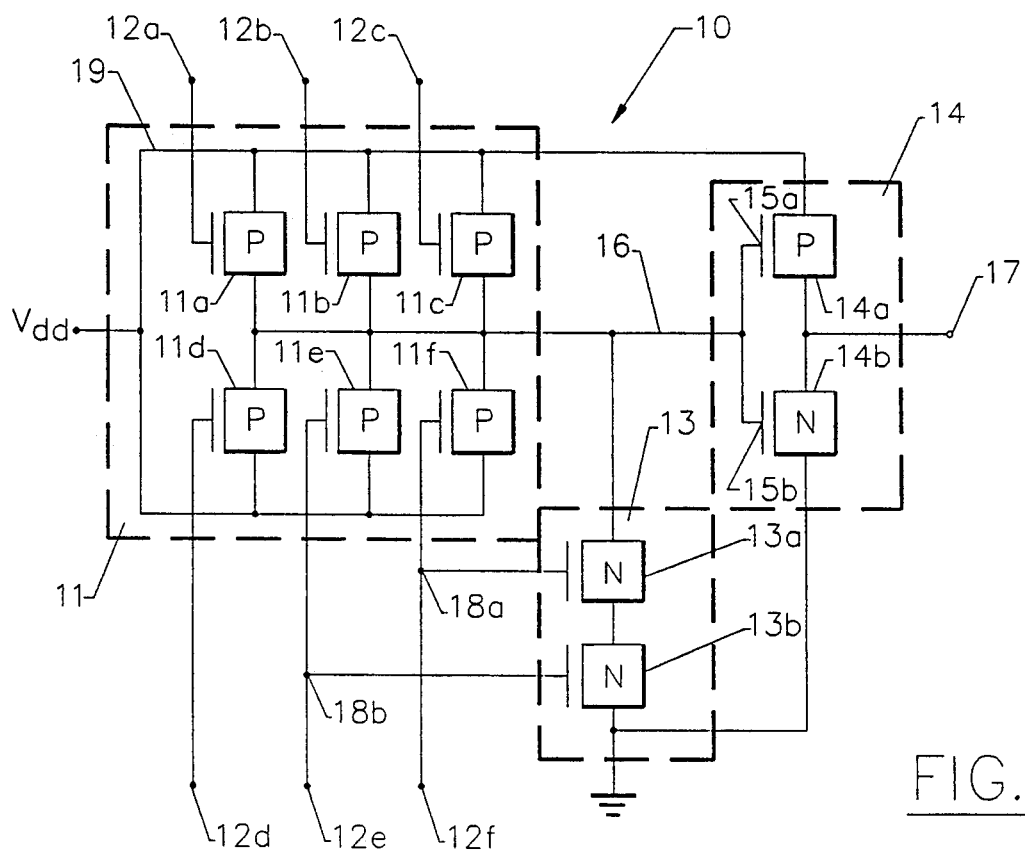
FIG. 3 is a schematic circuit diagram of a CLIP AND logic circuit according to the present invention.

Referring now to FIG. 3 a CLIP AND logic circuit 10 according to the present invention will now be described. The circuit of FIG. 3 includes a driving stage 11 which comprises a plurality of P-channel FETs 11a–11f. In FIG. 3 six driving stage FETs 11 are shown, however it will be understood by those having skill in the art that any number of driving stage FETs may be used. In fact, the CLIP logic circuit 10 permits larger numbers of logical inputs to be handled than conventional CMOS logic gates.

Each of the driving stage FETs 11 includes a control electrode 12a–12f for receiving logic input signals. The driving stage FETs 11 are connected in parallel between a first reference potential (power supply potential $V_{dd}$) and a common output 16. As will be described below, pairs of drains of driving stage FETs 11 may be connected to line 19 via a common diffusion, and pairs of sources of driving stage FETs 11 may be Connected to common output 16 via a common diffusion. The driving stage FETs are preferably enhancement type FETs having a conductive channel region between the drain and source when the potential at the control electrodes is near ground potential.

Still referring to FIG. 3 a complementary FET inverter 14 is serially connected between $V_{dd}$ and a second reference potential (ground), with the output 17 of the complementary inverter 14 being the output of the logic gate 10. The input of the complementary inverter (i.e. gates 15a and 15b) are also connected to the common output 16. According to the preferred embodiment of the invention, the design parameters of the complementary inverter transistors 14a and 14b are chosen so that a symmetric voltage transfer function is produced.

Still referring to FIG. 3 logic gate 10 also includes a gating stage 13 including a pair of gating transistors 13a, 13b serially connected between the common output 16 and the second reference potential (ground). As illustrated in FIG. 3, two gating transistors are used, however any number of gating transistors may be used. Control electrodes 18a and 18b are connected to the control electrodes 12f and 12e of transistors 11f and 11e respectively. Accordingly, gating transistors 13 are turned on when transistors 11e and 11f are turned off. It will be understood by those having skill in the art that control electrodes 18 may be connected to any of control electrodes 12.

According to the invention, the ratio of the channel width of the gating stage FETs 13 to the channel width of the driving stage FETs 11 bears a particular relationship for proper operation, as will be described in detail below.

Figure 4:
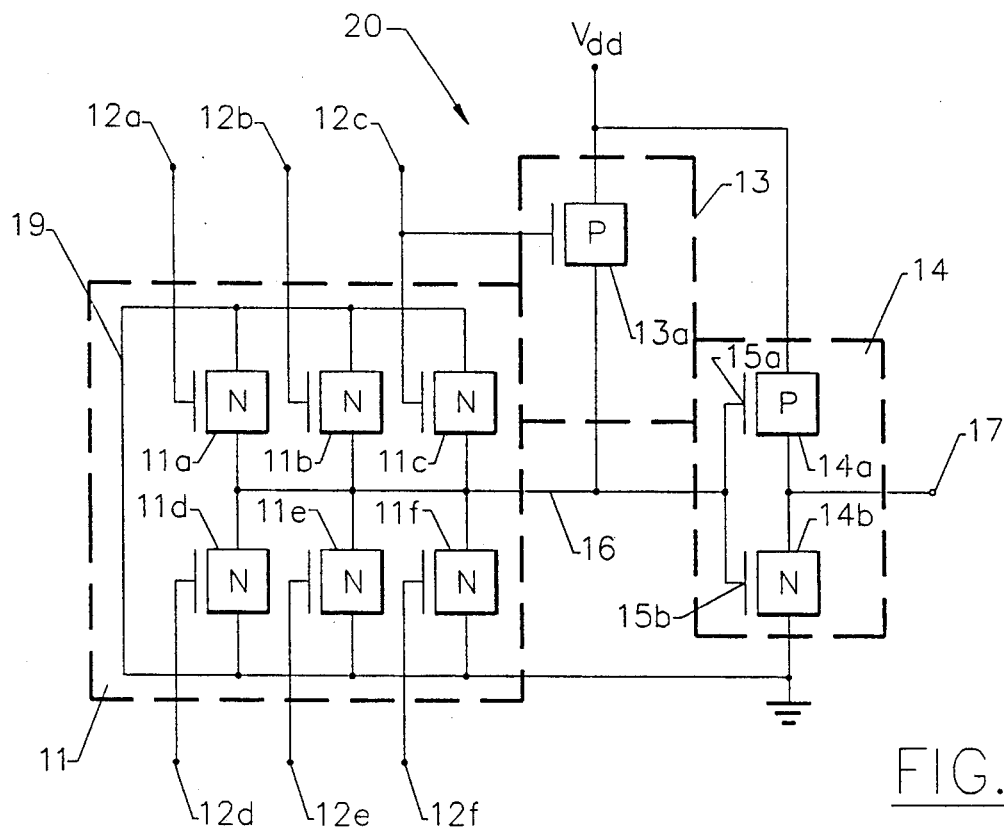
FIG. 4 is a schematic circuit diagram of a CLIP OR circuit according to the present invention.

Referring now to FIG. 4, a CLIP OR circuit 20 according to the present invention is shown. It will be seen that the circuit of FIG. 4 is identical with the circuit of FIG. 3 except the N and P devices have been interchanged and ground becomes $V_{dd}$ and $V_{dd}$ becomes ground. As shown in FIG. 4, a single P-channel gating stage transistor 13a is used. As is well known to those having skill in the art, an N-channel transistor is turned on with an up logic level and off with a down logic level while a P-channel transistor is turned off with an up logic level and on with a down logic level. Accordingly, the circuit of FIG. 3 provides an AND logic function and the circuit of FIG. 4 provides an OR logic function.

Figure 5:
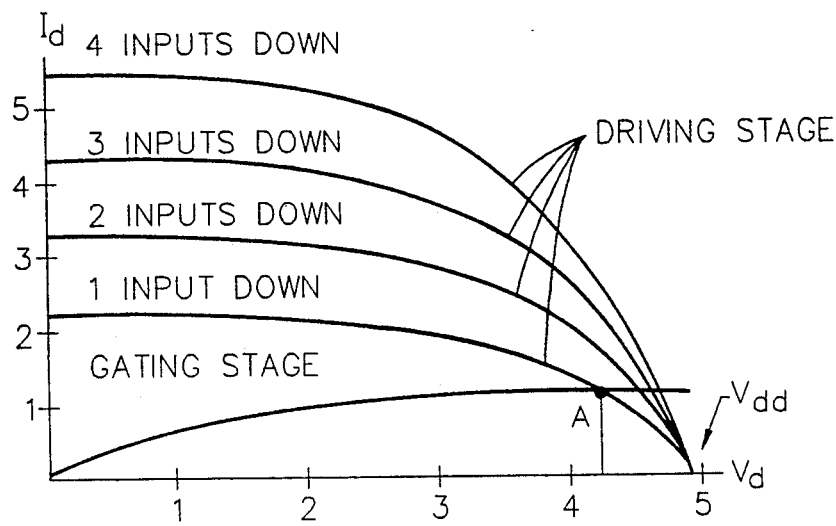
FIG. 5 graphically illustrates drain current versus drain voltage for the gating stage transistors and the driving stage transistors of the present invention.

The design of gating transistors 13 (FIGS. 3 and 4) according to the invention will now be described. FIG. 5 illustrates the drain current ($I_d$) versus drain voltage ($V_d$) property of the gating stage transistors 13 which is necessary for the logic circuits of FIGS. 3 and 4 to function properly. As shown in FIG. 5, the drain current versus drain voltage of the N-channel driving stage FETs 13 and the P-channel driving stage FETs 11 of FIG. 3 is shown. Four plots corresponding to four driving stage inputs 12 being at logic low level ("down") are shown. In other words, the lowest current plot shown for the driving stage corresponds to all but one driving stage control electrode 12 at supply potential $V_{dd}$.

The saturation drain current flowing in the gating transistor 13 must be below the saturation current corresponding to any individual driving stage transistor. Preferably the saturation current of any driving stage transistor should be twice the saturation current of the gating transistor 13. FIG. 5 shows the intersection point A where drain current in the P- and N-channel devices are identical. The worst case condition (i.e. all but one control electrode 12a–12f up) must occur at a drain potential below that value required to start switching the stage of the complementary inverter 14 to insure that unwanted positive logic output does not occur when any and only one of the gates of the driving transistors is not up.

The saturation current for P-channel devices with the same channel dimensions as an N-channel device is less by a factor of $\eta$, where $\eta$ is the ratio of carrier mobility in an N-channel device compared to a P-channel device. For identical saturation currents, the channel width of the P-channel device must be $\eta$ times the N-channel device, assuming identical channel length. Thus, the general design criteria for the series connected channel width $Z_n$ of the gating FETs 13 is:

$$Z_n = \frac{I^*_{satp}}{I^*_{satn}} Z_p \left(\frac{L_n}{L_p}\right) \frac{S_n}{2} \quad (2)$$

where $Z_n$ is the channel width of the N-channel gating FETs 13, $I^*_{satp}$ is the saturation current for a square channel P-channel FET, $I^*_{satn}$ is the saturation current for a square channel N-channel FET, $Z_p$ is the channel width of the P-channel driving FETs 11, $L_n$ is the channel length of the N-channel gating FETs 13, $L_p$ is the channel length of the P-channel driving FETs 13, and $S_n$ is the number of N-channel gating FETs 13.

The ratio of saturation currents is defined according to the following equation:

$$\eta = \frac{I^*_{satn}}{I^*_{satp}} \quad (3)$$

This ratio is typically 2.4 for pure silicon short channel devices. Accordingly, if the P-channel devices and N-channel devices of FIG. 3 have the same channel length and two N-channel devices are used as shown in FIG. 3, then Equation (2) reduces to:

$$Z_n = \frac{Z_p}{\eta} \quad (4)$$

Thus Equation (4) is a simplified critical design equation for proper operation of the clip AND circuit of FIG. 3, where $S_n$ is 2.

For the clip OR circuit of FIG. 4, Equation (2) applies, with the role of the N and P transistors being reversed. Accordingly:

$$Z_p = \frac{I^*_{satn}}{I^*_{satp}} Z_n \left(\frac{L_p}{L_n}\right) \frac{S_p}{2} \quad (5)$$

which, for the simplified case reduces to:

$$Z_p = \frac{Z_n \eta}{2} \quad (6)$$

FIGS. 3 and 4 illustrate that one or more serially connected gating transistors may be used in the gating stage 13. The number of transistors used depends upon the application and the logic function required. For example, a number greater than one can be used to control the power dissipation of the circuits when multiple circuits are attached to a common register. Accordingly, in FIG. 4 only one transistor is shown and in FIG. 3 two transistors are shown.

Applying Equation (2) to a particular design example of the clip AND circuit of FIG. 3, where all of the devices have the same channel length and all of the devices are fabricated in silicon integrated circuit silicon having $\eta$ of about 2.4; if the driving stage transistors 11 have a channel width of 5µ then the gating stage FETs 13 are designed to have a width of about 2µ according to the present invention. P-channel FET 14a has a width of about 11µ and N-channel FET 14b has a width of about 5µ. Similarly, in FIG. 4, the driving stage FETs 11 have width 5µ and the single gating stage transistor 13a has width 6.25µ, with transistor 14a having width 11µ and 14b having width 5µ.

Figure 6:
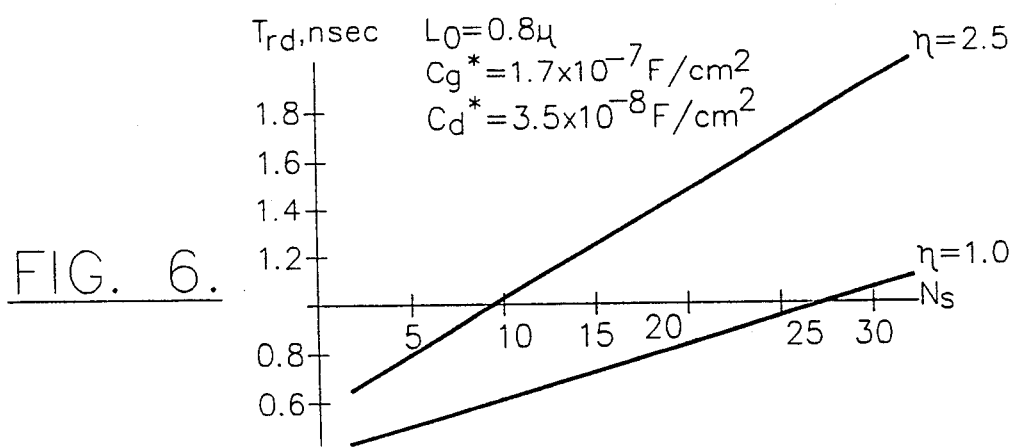
FIG. 6 graphically illustrates rise delay time versus number of inputs for the CLIP AND gate of FIG. 3.

Referring now to FIG. 6, the results of a computer simulation of a multiple input CLIP AND gate of FIG. 3 is illustrated. FIG. 6 illustrates the rise delay time of the gate of FIG. 3 as a function of the number of driving stage gates $N_s$. An output pulse only occurs at the output terminal of the complementary inverter when and only when all gates of the driving stage transistors 11 are up at the supply voltage $V_{dd}$. The CLIP AND circuit is of fundamental importance in static random access memory (SRAM) system design where it is required to decode address registers with a minimum delay time and minimum capacitive loading of the register output. Decode time is typically 0.9 nanosecond for this circuit, as opposed to CMOS tree logic that takes typically two nanoseconds to decode a nine input logic function. Channel lengths of 0.8µ are assumed.

The CLIP AND circuit of FIG. 3 can be used to efficiently decode large numbers of digital signal inputs with far less components than conventional CMOS technology, with a great reduction in decode time and with minimum capacitive loading of the driving register output. The expression for rise delay time for the CLIP AND logic gate of FIG. 3 (graphically illustrated in FIG. 6) is given below.

$$T_{rd} = \frac{2L_o V_{dd}}{I_{nsat}^*} \left[ C_d^* L_d \left( \frac{\eta N_s}{2} + 1 \right) + C_g^* \frac{Z_i}{Z_n} L_o(1 + \eta) \right] \quad (7)$$

Where;
$C_d^*$ = diffusion capacity F/cm²
$C_g^*$ = gate capacity F/cm²
$N_s$ = number of driving stage gates 11
$Z_i$ = Channel Width of N-channel device 14b in output inverter 14.
$\eta = I^*_{nsat}/I^*_{psat}$
$L_o$ = channel length
$L_d$ = length of drain and/or source diffusion
$Z_n$ = width of N-channel device in the "AND" gate FIG. 6 compares the effects of variations in $\eta$, with $\eta$ of 2.5 for pure N- and P-channel silicon and also $\eta$ of 1 when the P-channel silicon device is nominally doped with germanium as described below.

The rise delay time for the CLIP OR circuit of FIG. 4 is given by Equation (8)

$$T_{rd} = \frac{L_o V_{dd}}{I_{nsat}^*} \left[ C_d^* L_d \left( \frac{N_s}{2} + \frac{\eta}{2} \right) + C_g^* \cdot \frac{Z_i}{Z_n} L_o(1 + \eta) \right] \quad (8)$$

Figure 7:
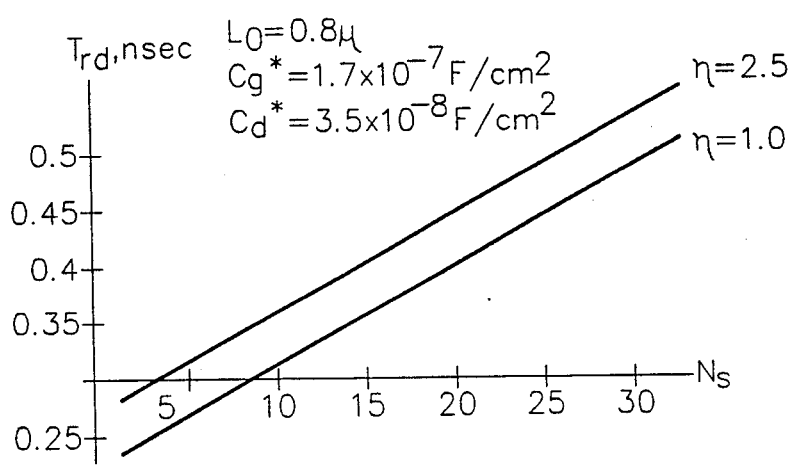
FIG. 7 graphically illustrates rise delay time versus number of inputs for the CLIP OR gate of FIG. 4.

The rise delay is plotted in FIG. 7 as a function of the number of driving stage gates $N_s$. Rise delay of this circuit is less than the transit time through $N_s$ CMOS devices connected in series. Accordingly, it has been shown that CLIP logic circuits of the present invention have very low rise delay properties even for as many as 32 input signals.

Clocked CLIP Logic Gates

Figure 8:
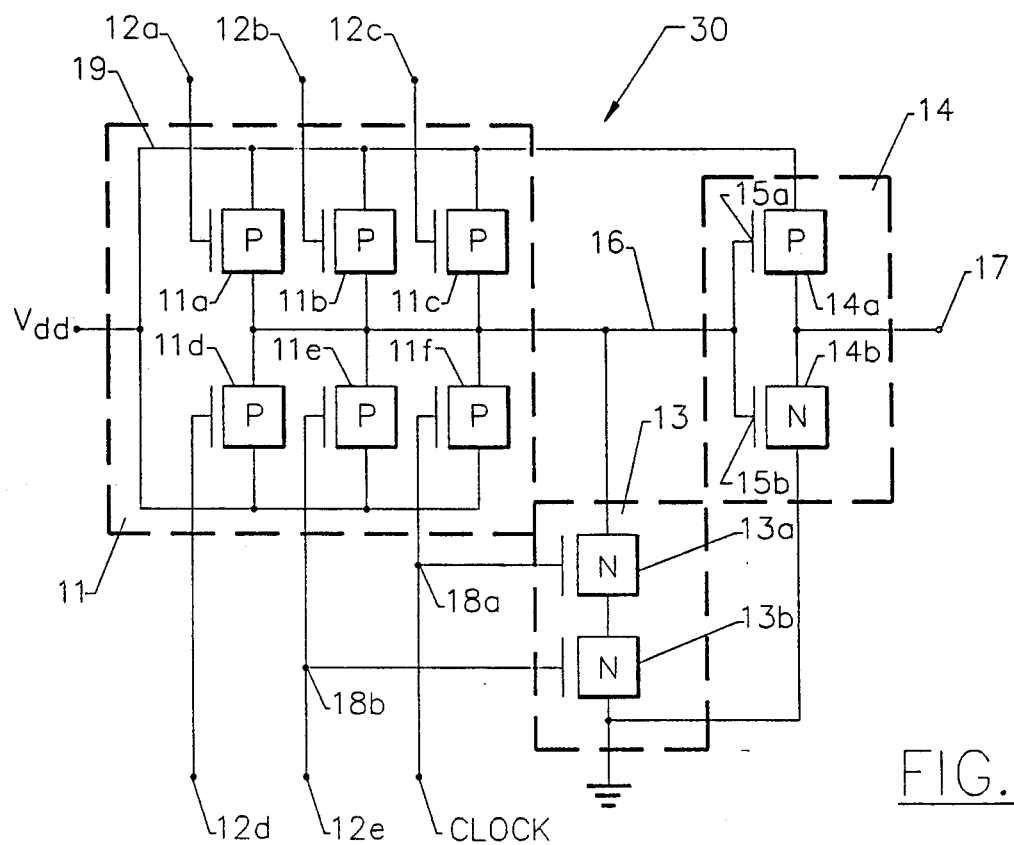
FIG. 8 is a schematic circuit diagram of a clocked CLIP AND gate according to the present invention.

The clocked CLIP logic circuits of the present invention will now be described. The clocked CLIP AND logic circuit 30 of FIG. 8 is identical to the unclocked AND circuit of FIG. 3 except one of the inputs 12 is a "clock" input, for receiving a clock signal instead of a logic input signal. Comparing FIGS. 3 to FIG. 8 it may be seen that logic input 12f has been replaced by a clock input. However, it will be understood that any other input 12 may be replaced with the clock input, or an additional driving stage transistor 11 may be added to accommodate the clock input. In the clocked AND gate, the output 17 is high when all of the gates 12a-12e are high and the clock is high. The design considerations described above for the gating stage 13 also apply to FIG. 8. Minimal power, typically one milliwatt, is dissipated only during the clock time interval.

Figure 9:
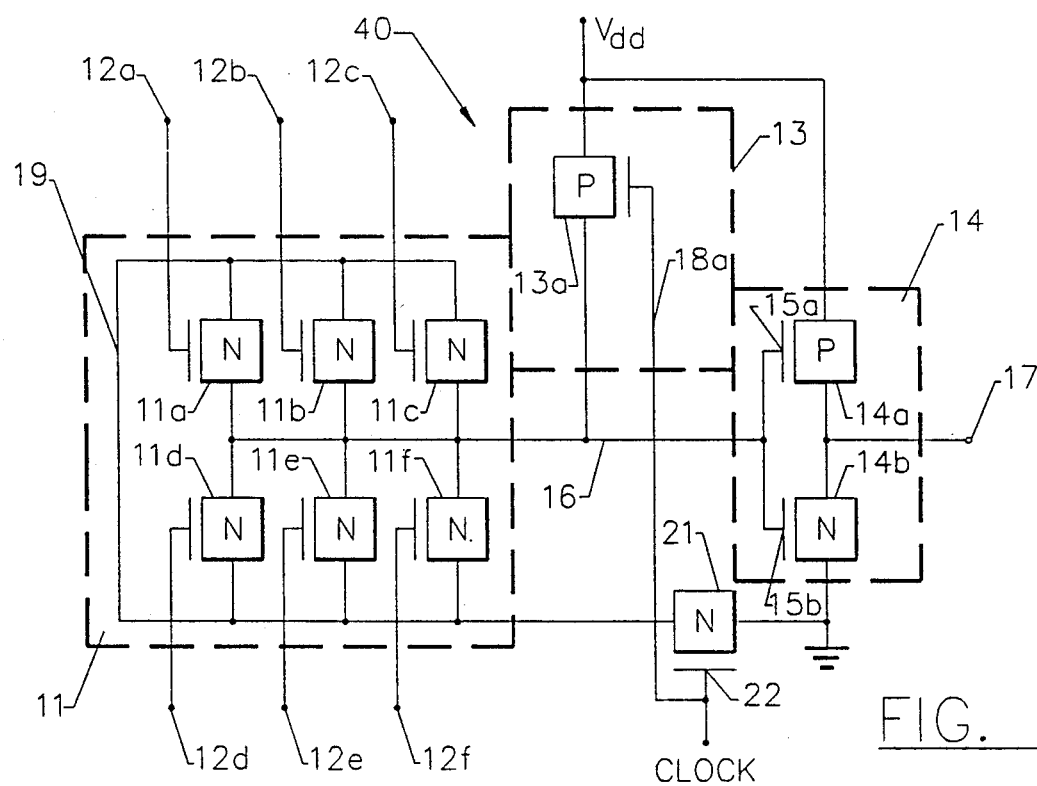
FIG. 9 is a schematic circuit diagram of a clocked CLIP OR gate according to the present invention.

Referring now to FIG. 9, a clocked CLIP OR circuit 40 is shown. This circuit differs from the CLIP OR circuit of FIG. 4 in two respects. First, the input control gate 18a of gating stage FET 13a is driven by a clock input. Also, clocking FET 21 is placed in series between second common output line 19 and ground, and the control electrode 22 is also connected to the clock input. When a clock pulse is applied, clocking FET 21 is turned on and gating FET 13 is turned off. If any one or more of the logic control gates 12a-12f are up then the output of inverter 14 rapidly rises to supply potential $V_{dd}$. When the clock pulse drops to ground potential, clocking FET 21 is turned off and gating FET 13 is turned on. When this occurs, the potential of the common output 16 rises rapidly to supply potential $V_{dd}$ and the output 17 of the inverter 14 rapidly drops to ground potential.

The clocked CLIP OR circuit of FIG. 9 does not have a restriction on the channel width of the gating FET channel. In other words, Equations (5) and (6) do not apply to the clocked CLIP OR circuit of FIG. 9. No DC power is dissipated by this circuit. Rise delay for this circuit is essentially the same as that illustrated by FIG. 7.

Latching Clocked CLIP Logic Gates

Figure 10:
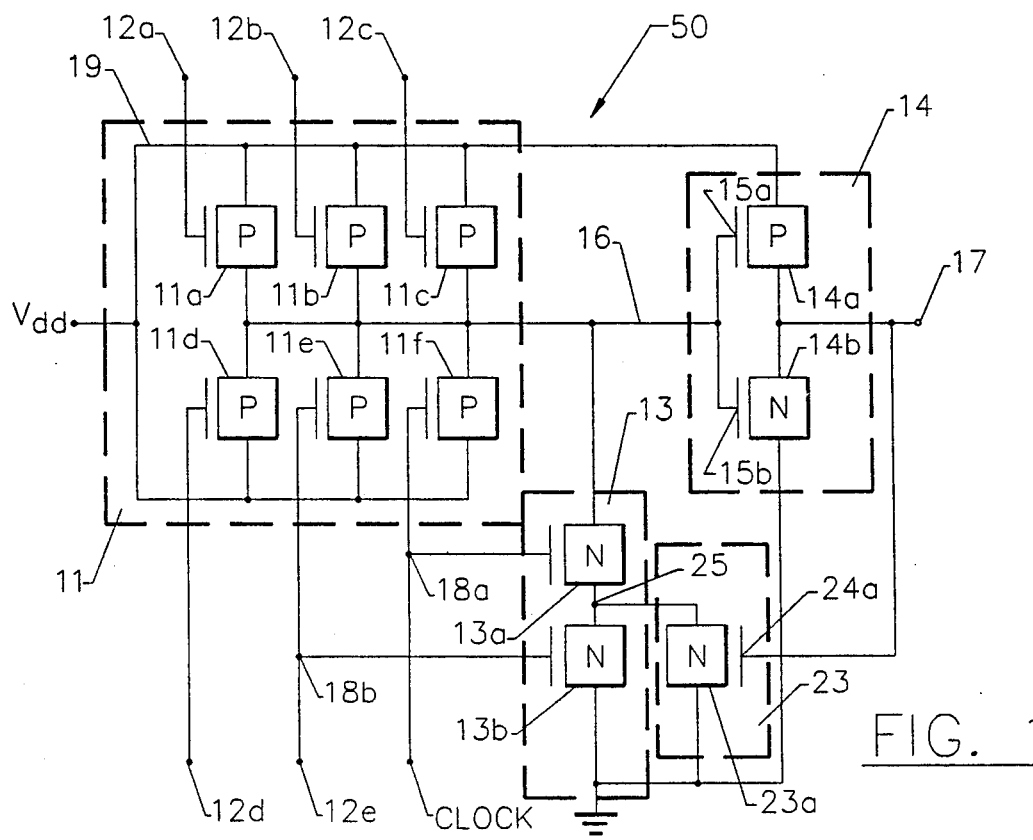
FIG. 10 is a schematic circuit diagram of a latching clocked CLIP AND gate according to the present invention.

Referring now to FIG. 10, a latching clocked CLIP AND gate 50 according to the present invention will now be described. Latching clocked CLIP AND gate 50 is identical to clocked AND gate 30 of FIG. 8, except that a latching stage 23 comprising a latching FET 23a is added. The control electrode 24a of latching FET 23a is connected to the output 17 of the complementary inverter 14. The latching FET 23a is connected between ground and the serially connected gating FETs 13a and 13b respectively. In the design example described for FIG. 3, the channel dimensions of latching FET 23 are the same as 13a or 13b. When a single gating FET is used in gating stage 13, clocking FET 23a is connected between ground and the common signal line 16. Latching FET 23 ensures that the output 17 of complementary inverter 14 remains unchanged during the clock period, regardless of any change in voltage at the inputs 12a-12e.

Figure 11:
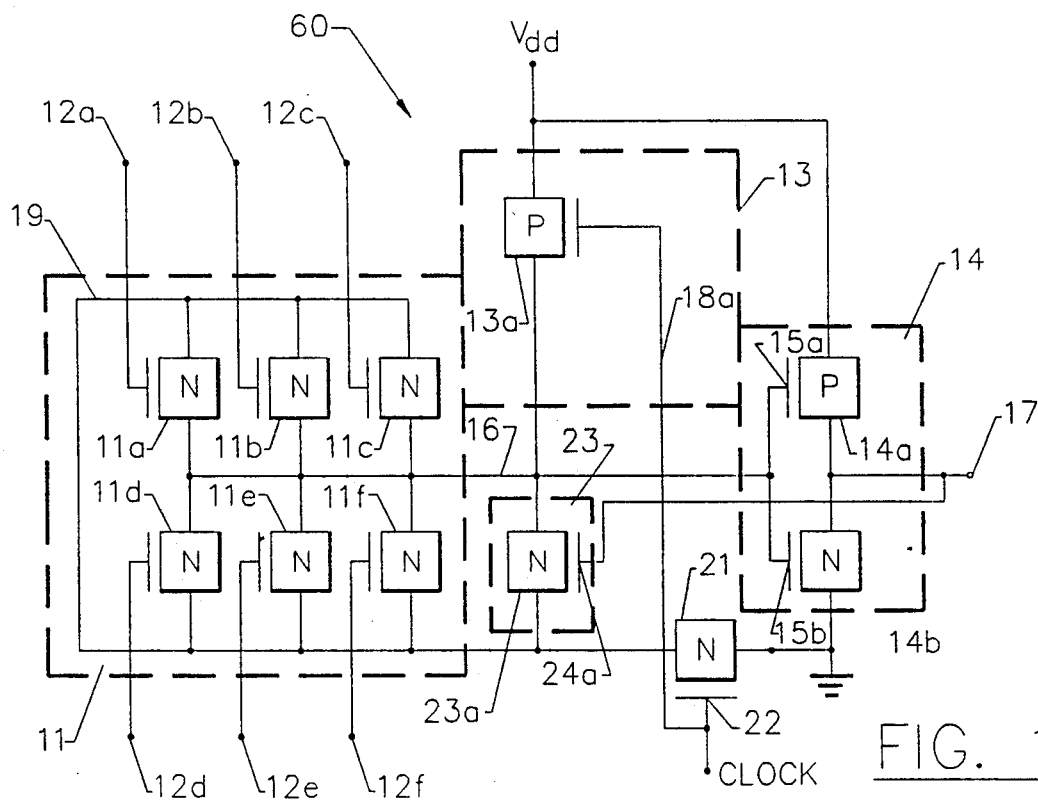
FIG. 11 is a schematic circuit diagram of a latching clocked CLIP OR gate of the present invention.

Referring now to FIG. 11, a latching clocked CLIP OR circuit will be described. As shown in FIG. 11, the latching clock clip OR circuit differs from the clocked clip OR circuit of FIG. 9 by adding latching FET stage 23 comprising N-channel FET 23a, which is connected between line 19 and the common output 16. The output 17 of complementary inverter 14 is fed back to the gate 24a of the latching FET 23a. In the design example used above, the channel width of the clocking FET 21 is 20μ and the width of the latching FET 23 is 5μ.

In operation, a clock pulse up level connects the gating point to ground potential via clocking stage 21, while simultaneously disconnecting the common output 16 from the supply voltage $V_{dd}$ by turning off the gating FET 13a. During the clock pulse interval, if any one of the driving stage transistors 11a-11e is turned on by virtue of its control 12a-12f being at supply potential, the output 17 of the complementary inverter 14 is switched up to supply voltage $V_{dd}$. When this condition occurs, FETs 21 and 23 conduct, thereby latching the complementary inverter output 17 up at the supply potential until the end of the clock pulse. When the clock pulse potential drops to ground potential, gating FET 13 turns on and clocking FET 21 turns off, forcing the output of the complementary inverter 14 to rapidly drop to ground potential while simultaneously turning off latching transistor 23. If all of the driving stage resistors 11a-11e are not conditioned for conduction by virtue of their control gates being at ground potential, the output of complementary inverter 14 remains at ground potential during the clock pulse.

Latching CLIP Output Logic Cell

Figure 12A:
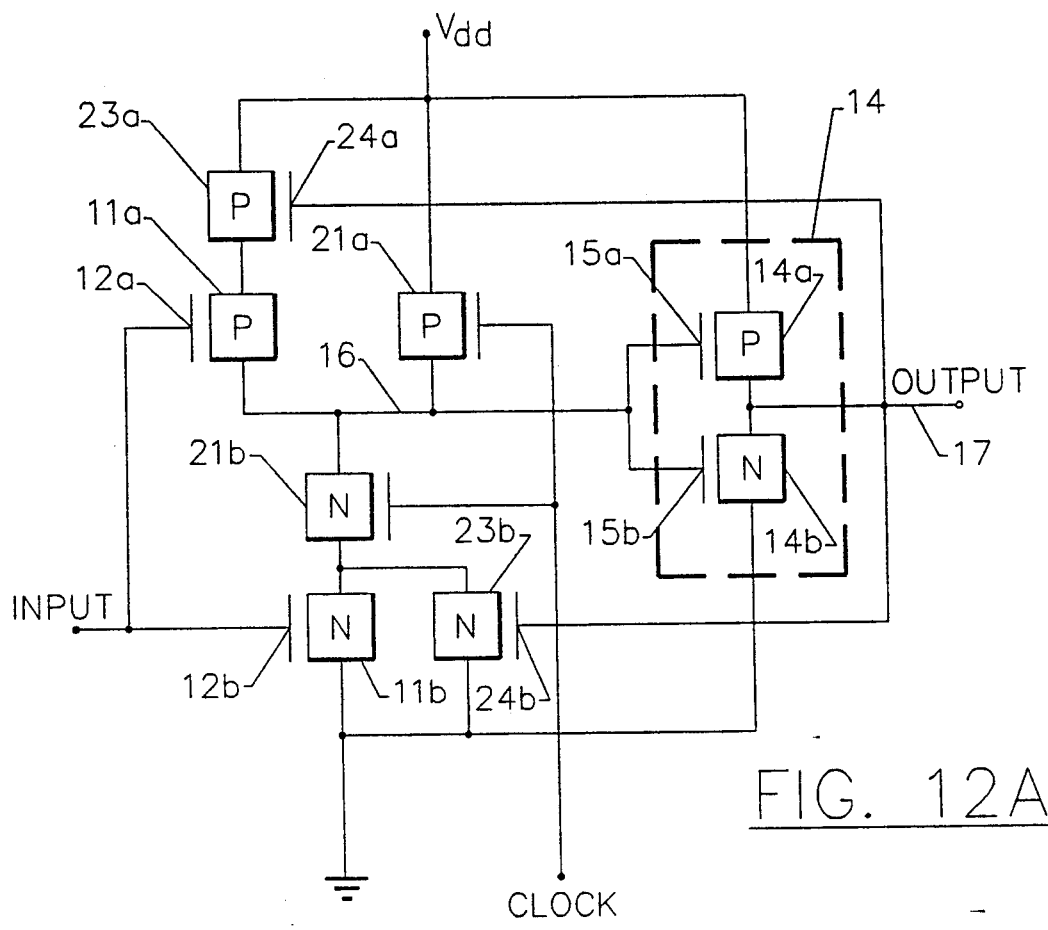
FIG. 12A is a schematic circuit diagram of a latching CLIP output logic cell according to the present invention.

Referring now to FIG. 12, a latching CLIP logic cell is shown. Any positive signal applied to the input of this circuit is latched at the output during the clock pulse interval regardless of whether the input signal drops during or after the clock pulse interval. As shown in FIG. 12A, the circuit includes P- and N-channel driving stage FETs 11a and 11b respectively, the control electrodes 12a and 12b of which respectively are connected to the logic input. A pair of clocking FETs 21a and 21b are connected to a clock input. A pair of latching FETs 23a and 23b have their control electrodes 24a and 24b connected to the gate output 17. A complementary inverter 14 comprising a pair of FETs 14a and 14b have their control inputs connected to the common node 16.

Figure 12B:
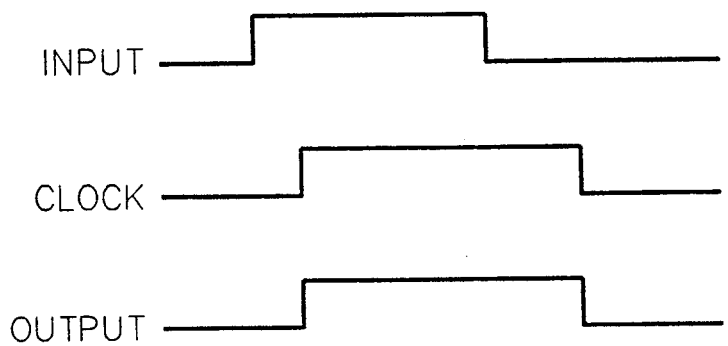
FIG. 12B is a timing diagram for the circuit of FIG. 12A.

As shown in FIG. 12B, any positive signal applied to the input of this circuit is latched at the output during the clock pulse interval regardless of whether the input signal drops during or after the clock pulse interval.

Germanium P-Channel FETs

As heretofore described, the N- and P-channel devices of the CLIP logic gates were conventionally doped silicon logic gates. For a given gate area and gate to source voltage, it is well known that silicon P-channel devices deliver about half the saturation current as a corresponding N-channel FET device. According to the present invention, P-channel silicon FETs can be improved to closely resemble N-channel FET properties by implanting or otherwise placing germanium ions in the channel regions of P-channel silicon devices, with the N-channel silicon devices being free of germanium. The germanium enhances the high field mobility of holes within the P-channels and increases the intrinsic carrier concentration.

Germanium also effectively reduces gate and diffusion capacity for the P-channel devices, since gate and diffusion capacity decrease with channel width. Notwithstanding the decreases in gate and diffusion capacity, the same current may be supported as a silicon N-channel device. The Fermi potential of the germanium compensated P-channel region is less than the N-channel silicon region due to the increase in the intrinsic carrier concentration for a given temperature. However, the threshold voltage for P-channel compensated devices can be made to be equal to the N-channel silicon device, particularly if Fermi Threshold FET transistors are used. The design and operation of the Fermi Threshold FET transistor are described in U.S. patent application Ser. No. 07/318,043 now U.S. Pat. No. 4,990,974, application Ser. No. 07/370,398 now U.S. Pat. No. 4,984,043 (Jan. 8, 1991), and application Ser. No. 07/646829 filed Jan. 25, 1991 all filed by the present inventor Albert W. Vinal and assigned to the assignee of the present invention, the disclosures of which are hereby incorporated herein by reference.

In a preferred embodiment of the present invention, P-channel mobility can be increased to closely match N-channel mobility in silicon when about 36 atomic percent of the P-channel region is germanium atoms. Germanium may be introduced into a silicon substrate in the N-channel regions using ion implantation techniques such as those described in U.S. Pat. No. 4,928,156 to Alvis et al. Other well known techniques may be used. As will be understood by those having skill in the art, in order to dope the P-channel FETs with germanium, the N-channel FETs may be covered by an appropriate mask so that the germanium ions are implanted only in the channel regions of the P-channel FET devices, and the N-channel FET devices are free of germanium doping.

It will also be understood by those having skill in the art that germanium may be introduced into P-channel FET devices of conventional MOSFET circuits and in the Fermi Threshold FET of the above identified patent application and patent. When used with the Fermi Threshold FET, the depth of the germanium implant should be slightly in excess of the Fermi depth $Y_o$ (as defined in the above cited patent and patent application). It will also be understood by those having skill in art that the germanium implant may extend beyond the P-channel region to include the FET source and drain regions of the P-channel FETs in order to enhance the attainment of shallow or abrupt junctions in these regions.

There are two primary effects of implanting germanium ions in the channel region of P-channel FETs. First, mobility μ of holes within the germanium doped silicon P-channel region increases in proportion to the annealed percentage concentration Z of germanium in silicon according to the following relationship: $\mu_p = 550 + 1300Z$. Accordingly, adding germanium to P-channel FET devices allows for a better match between N and P-channel device current drive capabilities for a given gate and drain voltage.

Second, it is well known to those having skill in the art that boron is typically present in germanium. The presence of boron tends to make the boron depth profile more consistent with theoretical predictions. In other words, the boron depth profile is more abrupt than without germanium. This allows well controlled shallow P-type Fermi channel depths to be achieved.

A typical dose for germanium in the P-channel region of silicon FETs is $1E14/cm^2$ or greater at an energy above 100 kev. Actual implant energy must be consistent with the desired Fermi depth. This is a moderate dose factor since the lattice constant for silicon is 5.43 Å and 5.65 Å for germanium, and a dose of $1E14/cm^2$ leads to a doping spacing of about 10 Å.

Figure 13A:
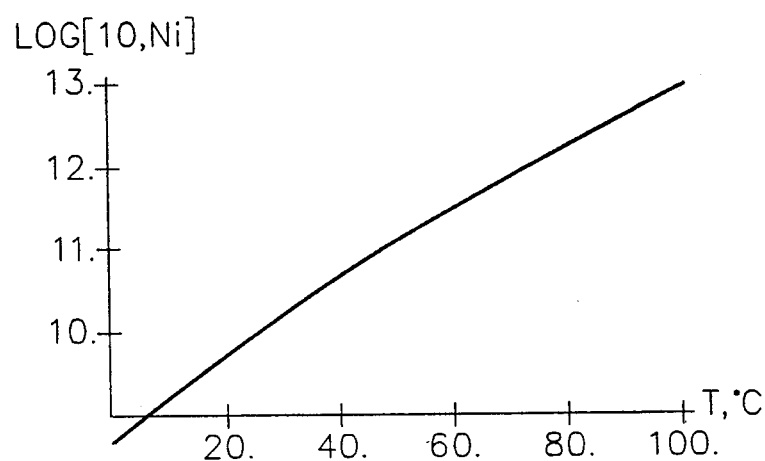
FIGS. 13A and 13B graphically illustrate intrinsic carrier concentration versus temperature for pure silicon transistor and 38 atomic percent germanium in silicon transistors according to the present invention.
Figure 13B:
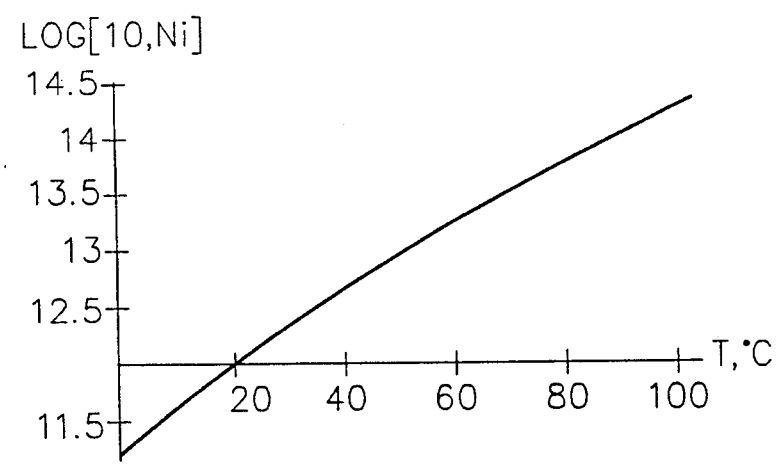

The intrinsic carrier concentration for a given temperature within the germanium doped silicon channel region is greater than pure silicon and less than pure germanium. Intrinsic carrier concentration $N_i$ for a given material depends on the energy gap of the material and controls its Fermi potential. The intrinsic carrier concentration $N_1$ for silicon and 38% germanium doped silicon are plotted in FIGS. 13A and 13B as a function of centigrade temperature, where:

$$N_i(T) = N_{substrate}\left(\frac{T}{T_{red}}\right)^{\frac{3}{2}}[2(-\frac{q}{k})(\frac{E_{gref}}{T_{ref}} - \frac{E_g(t)}{T} - \frac{2\phi_f}{T_{ref}})] \quad (9)$$

where
T is the actual temperature in degrees Kelvin,
$T_{ref}$ is room temperature (27° C., 300K),
$\phi_f$ is the substrate Fermi potential,
$E_{gref}$ is the energy gap between valence and conduction bands at room temperature,
$E_g(T)$ is the energy gap at new temperature,
$N_{substrate}$ is the dopant concentration of the substrate per cm$^3$,
K is Boltzman's Constant, and
q is the electron change.

The energy gap is defined in electron volts and for silicon has the following temperature dependence:

$$E_g(T) = E_g(T_{ref}) - \left[\frac{7.02e^{-4}T^2}{T + 1108.0}\right] \quad (10)$$

Intrinsic carrier concentration is an important factor in high temperature environments and may limit the percent of germanium channel doping. However, the advantages of doping silicon P-channel devices with germanium outweigh the thermal penalties when it is desired to operate complementary logic circuits at their maximum speed while consuming the least chip area and circuit power.

Common Diffusions For Driving Stage FETs

As already described, the CLIP logic circuits include a driving stage 11 having a plurality of driving stage FETs which are connected between a common output 16 and a power supply voltage (ground or $V_{dd}$). The diffusion capacity loading of the common signal output bus 16 is a speed limiting factor for these circuits. Therefore, according to the invention, the CLIP circuits illustrated by FIGS. 3, 4 and 8–11 share diffusions that are connected to the common signal bus. The shared diffusion reduces diffusion capacity loading by a factor of two. The capacitive loading effect on rise and fall delay times is thereby minimized.

Figure 14A:
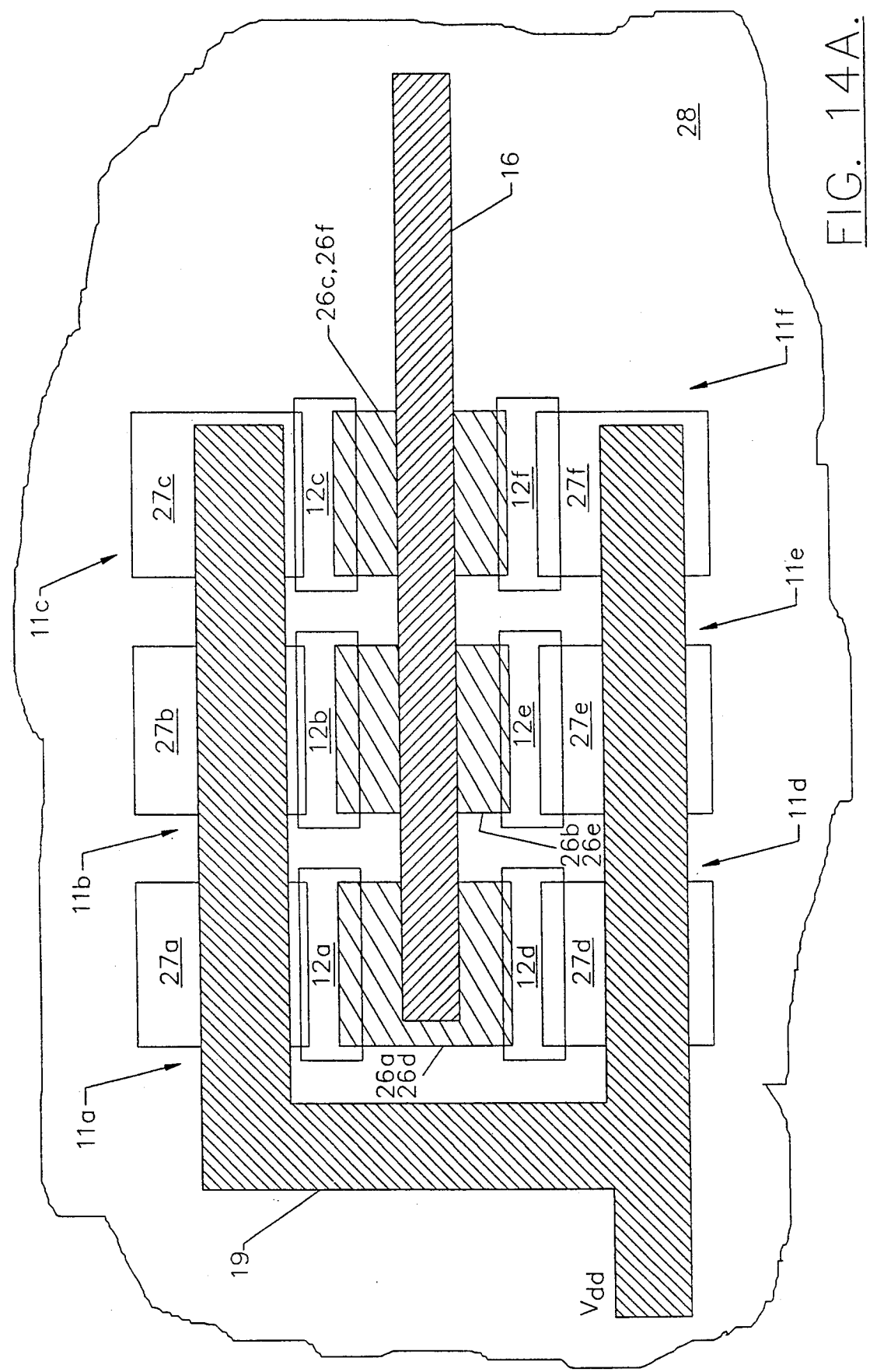

Referring now to FIGS. 14A and 14B, two techniques for connecting the driving stage transistors 11 of the CLIP logic circuits between a first and second potential and the common signal bus so as to share diffusions connected to the output signal bus are shown. Referring to FIG. 3 and FIG. 14A in combination, the driving transistors 11a–11f are illustrated in a portion of an integrated circuit substrate 28. As shown, the drains 27a–27f are connected via line 19 to power supply voltage level $V_{dd}$. Three vertical shared source regions are found in three common diffusion regions. The first diffusion shares sources 26a and 26d, the second diffusion shares sources 26b and 26e, and the third diffusion shares sources 26c and 26f. All of the shared sources 26a–26f are connected to the common output 16. By sharing sources 26a–26f, capacitance at the common output 16 is reduced in half.

FIG. 14B illustrates shared source diffusion regions which are shared horizontally rather than vertically. As also shown in FIG. 14B, drains 27 are connected to power supply $V_{dd}$ via common diffusions. It will be understood by those having skill in the art that the shared diffusion technique may be used for any all-parallel logic circuit to reduce diffusion capacitance by a factor of two.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A complementary logic input parallel (CLIP) field effect transistor (FET) logic circuit comprising:
   a driving stage including at least one FET of a first conductivity type, having at least one control electrode for receiving logic input signals, the at least one driving stage FET being connected between a common output and a first potential level;
   at least one gating FET of second conductivity type, connected between a second potential level and said common output, said at least one gating FET having at least one control electrode which is connected to a control electrode of said at least one driving stage FET, the ratio of the channel width of the at least one gating FET to the channel width of the at least one driving stage FET being the ratio of the square channel saturation current of said at least one driving stage FET to the square channel saturation current of said at least one gating FET times the ratio of the channel length of the at least one gating FET to the channel length of the at least one driving stage FET, times the number of said at least one gating FET divided by two; and
   a complementary FET inverter comprising an FET of said first conductivity type and an FET of said second conductivity type, serially connected between said first and second potential levels, and having an inverter input, the inverter input being connected to said common output.

2. The CLIP FET logic circuit of claim 1 wherein said at least one gating FET consists of one gating FET having a control electrode which is connected to a control electrode of one of said at least one driving stage FET, the channel lengths of said at least one driving stage FET being equal to the channel length of said gating FET, said ratio of channel width of said one gating FET to the channel width of said at least one driving stage FET being one half the ratio of the square channel saturation current of said at least one driving stage FET to the square channel saturation current of said one gating FET.

3. The CLIP FET logic circuit of claim 1 wherein said at least one driving stage FET comprises at least two driving stage FETs and wherein said at least one gating FET consists of two gating FETs serially connected between the second potential level and said common output, a respective control electrode of each of said two gating FETs being connected to a respective control electrode of said at least two driving stage FETs, the channel lengths of said at least two driving stage FETs being equal to the channel lengths of said two gating FETs, the ratio of the channel width of said two gating FETs to said at least two driving stage FETs being the ratio of the square channel saturation current of said at least two driving stage FETs to the square channel saturation current of said two gating FETs.

4. The CLIP FET logic circuit of claim 1 wherein said FETs of a first conductivity type comprise P-channel FETs, and wherein said FETs of said second conductivity type comprise N-channel FETs, to thereby provide a CLIP AND circuit.

5. The CLIP FET logic circuit of claim 1 wherein said driving stage further comprises a clocking FET of said first conductivity type, having a control electrode for receiving a clock input signal, the clocking FET being connected between said common output and said first potential level, to provide a clocked CLIP circuit.

6. The CLIP FET logic circuit of claim 5 wherein said at least one control electrode of said at least one gating FET is connected to said clocking FET control electrode.

7. The CLIP FET logic circuit of claim 1 further comprising a latching FET of said second conductivity type, having a control electrode which is connected between said serially connected FETs in said complementary inverter, said latching FET being connected in parallel with at least one of said gating FETs, to provide a latching CLIP circuit.

8. The CLIP FET logic circuit of claim 1 wherein said driving stage includes at least one pair of FETs of said first conductivity type, said pair of FETs being connected to said common output via a common diffusion.

9. The CLIP FET logic circuit of claim 1 wherein said driving stage includes at least one pair of FETs of said first conductivity type, said pair of FETs being connected to said first potential level via a common diffusion.

10. The CLIP FET logic circuit of claim 4 wherein said P-channel FETs and said N-channel FETs are fabricated in monocrystalline silicon, wherein the channels of said P-channel FETs include germanium to thereby increase the carrier mobility in said P-channel FETs, and wherein the channels of said N-channel FETs are free of germanium.

11. The CLIP FET logic circuit of claim 10 wherein channels of said P-channel FETs include germanium in sufficient concentration to equalize the carrier of said P-channel FETs and said P-channel FETs.

12. The CLIP FET logic circuit of claim 1 wherein said FETs of a first conductivity type comprise N-channel FETs, and wherein said FETs of a second conductivity type comprise P-channel FETs, to thereby provide a logic OR gate.

13. The CLIP FET logic circuit of claim 12 wherein said P-channel FETs and said N-channel FETs are fabricated in monocrystalline silicon, wherein the channels of said P-channel FETs include germanium to thereby increase the carrier mobility in said P-channel FETs, and wherein the channels of said N-channel FETs are free of germanium.

14. The CLIP FET logic circuit of claim 13 wherein said channels of said P-channel FETs include germanium in sufficient concentration to equalize the carrier mobilities of said N-channel FETs and said P-channel FETs.

15. A clocked complementary logic input parallel (CLIP) field effect transistor (FET) OR logic circuit comprising:

a driving stage, including at least one N-channel FET, having at least one control electrode for receiving logic input signals, the at least one driving stage FET being connected between a first common output and a second common output;

a complementary FET inverter comprising an N-channel FET and a P-channel FET serially connected between a first potential level and a second potential level, and having an inverter input and an inverter output, the inverter input being connected to said first common output;

an N-channel clocking FET, having a control electrode for receiving a clock input signal, said clocking FET being connected between said second potential level and second common output; and a P-channel gating FET, the control input of which is connected to the control electrode of said clocking FET, said gating FET being connected between said first potential level and said first common output.

16. The clocked CLIP FET logic circuit of claim 15 further comprising an N-channel latching FET, the control electrode of which is connected to said inverter output said latching FET being connected between said first and said second common outputs to provide a latching clocked CLIP OR FET circuit.

17. The clocked CLIP FET logic circuit of claim 15 wherein said driving stage includes at least one pair of N-channel FETs, said pair of N-channel FETs being connected to said first common output via a common diffusion.

18. The clocked CLIP FET logic circuit of claim 15 wherein said driving stage includes at least one pair of N-channel FETs, said pair of N-channel FETs being connected to said second common output via a common diffusion.

19. The clocked CLIP FET logic circuit of claim 15 wherein said P-channel FETs and said N-channel FETs are fabricated in monocrystalline silicon, wherein the channels of said P-channel FETs include germanium to thereby increase the carrier mobility in said P-channel FETs, and wherein the channels of said N-channel FETs are free of germanium.

20. The clocked CLIP FET logic circuit of claim 19 wherein said channels of said P-channel FETs include germanium in sufficient concentration to equalize the carrier mobilities of said N-channel FETs and said P-channel FETs.

21. A field effect transistor (FET) logic circuit comprising:

a plurality of interconnected N-channel FETs and P-channel FETs fabricated in monocrystalline silicon, said plurality of FETs being connected to a plurality of logic input signals and to a logic circuit output to provide a predetermined logical function of said logic input signals at said logic circuit output; the channels of said P-channel FETs including germanium to thereby increase the carrier mobility in said P-channel FETs; the channels of said N-channel FETs being free of germanium doping; wherein said channels of said P-channel FETs includes about 38 atomic percent germanium.

22. A latching complementary logic input parallel (CLIP) field effect transistor (FET) output logic cell comprising:

first and second FETs of a first conductivity type, serially connected between a first potential level and a common output;

third and fourth FETs of a second conductivity type, serially connected between a second potential level and the common output, the control electrodes of said second and fourth FETs being connected together for receiving a logic input signal;

a complementary FET inverter having an inverter input and an inverter output, the inverter input being connected to said common output;

a fifth FET of said first conductivity type, connected between said first potential level and said common output, the control electrodes of said third and fifth FETs being connected together for receiving a clock input signal; and a sixth FET of said second conductivity type, connected in parallel with said fourth FET, the control electrodes of said first and said sixth FETs being connected to said inverter output.

23. The latching CLIP FET output logic cell of claim 22, wherein said complementary FET inverter comprises a seventh FET of said first conductivity type and an eighth FET of said second conductivity type, serially connected between said first potential level and said second potential level, with the control electrodes of said seventh and eighth FETs being connected to said common output and with the inverter output being connected between said seventh and eighth FETs.

24. A complementary logic input parallel (CLIP) field effect transistor (FET) logic circuit comprising:

a driving stage including a plurality of driving stage FETs of a first conductivity type, each having at least one control electrode for receiving logic input signals, said plurality of driving stage FETs being connected between a common output and a first potential level;

at least one gating FET of second conductivity type, connected between a second potential level and said common output, said at least one gating FET having at least one control electrode which is connected to a control electrode of a respective at least one of said plurality of driving stage FETs, at least one of the dimensions of said at least one gating FET and said plurality of driving stage FETs being selected such that the saturation current of said at least one gating FET is less than the saturation current of any of said plurality of driving stage FETs; and a complementary FET inverter comprising an FET of said first conductivity type and an FET of said second conductivity type, serially connected between said first and second potential levels, and having an inverter input, the inverter input being connected to said common output.

25. The CLIP FET logic circuit of claim 24 wherein the dimensions of said at least one gating FET and said plurality of driving stage FETs are selected such that the saturation current of said at least one gating transistor is half the saturation current of any of said plurality of driving stage FETs.

* * * * *

UNITED STATES PATENT AND TRADEMARK OFFICE
CERTIFICATE OF CORRECTION

PATENT NO. : 5,247,212
DATED : September 21, 1993
INVENTOR(S) : Vinal

It is certified that error appears in the above-identified patent and that said Letters Patent is hereby corrected as shown below:

IN THE ABSTRACT: Item 57 (Title Page)

Line 1, "Capacitance" should be --capacitance--.

Column 3, line 19 "$Z_n = A_p/2\eta$" should be --$Z_n = Z_p/2\eta$--.

Column 3, line 66, "38" should be --38--.

Column 4, line 64, "38" should be --38--.

Column 6, line 55, "Connected" should be --connected--.

Column 6, line 62, delete indent before "FET".

Column 9, line 41, "Width" should be --width--.

Column 12, line 9, "07/646829" should be --07/646,829--.

UNITED STATES PATENT AND TRADEMARK OFFICE
CERTIFICATE OF CORRECTION

PATENT NO. : 5,247,212

DATED : September 21, 1993

INVENTOR(S) : Vinal

It is certified that error appears in the above-identified patent and that said Letters Patent is hereby corrected as shown below:

Column 12, line 15, "36" should be --36--.

Column 13, line 10, Equation (9): "$\frac{Eg(t)}{T}$" should be --$\frac{Eg(T)}{T}$--.

Column 13, line 10, Equation (9): "½" should be --¾--.

Column 15, line 47, after "carrier" insert --mobilities--.

Column 15, line 48, "P-channel" (first occurrence) should be --N-channel--.

Signed and Sealed this

Twenty-eighth Day of June, 1994

Attest:

BRUCE LEHMAN

*Attesting Officer*     *Commissioner of Patents and Trademarks*